(12) United States Patent
Ngo

(10) Patent No.: US 6,265,810 B1
(45) Date of Patent: Jul. 24, 2001

(54) PIEZOELECTRIC SUPPORT DEVICE

(75) Inventor: Hieu Thien Ngo, Gilbert, AZ (US)

(73) Assignee: The Boeing Company, Seattle, WA (US)

( * ) Notice: Subject to any disclaimer, the term of this patent is extended or adjusted under 35 U.S.C. 154(b) by 0 days.

(21) Appl. No.: 09/491,580

(22) Filed: Jan. 25, 2000

(51) Int. Cl.$^7$ ................................................ H01L 41/08
(52) U.S. Cl. ............................................ 310/328; 310/348
(58) Field of Search ........................................ 310/328, 348

(56) References Cited

U.S. PATENT DOCUMENTS

| 3,583,677 | * | 6/1971 | Phillips | 259/1 |
| 4,243,995 | | 1/1981 | Wright et al. | 346/140 R |
| 4,462,093 | * | 7/1984 | Upton | 367/165 |
| 5,115,880 | * | 5/1992 | Sallas et al. | 181/106 |
| 5,208,506 | | 5/1993 | Yamashita | 310/328 |
| 5,289,074 | * | 2/1994 | Mori | 310/328 |
| 5,424,596 | | 6/1995 | Mendenhall et al. | 310/328 |
| 5,455,477 | | 10/1995 | Sano et al. | 310/328 |
| 5,479,064 | | 12/1995 | Sano | 310/328 |
| 5,900,691 | | 5/1999 | Reuter et al. | 310/348 |
| 5,907,211 | | 5/1999 | Hall et al. | 310/328 |
| 5,925,971 | | 7/1999 | Unami | 310/328 |

OTHER PUBLICATIONS

Publication entitled "Wind Tunnel Evaluation of a Full Scale Piezoelectric Flap Control Unit" by D. Schimke; P. Janker; V. Wendt and B. Junker; pp. 1–12; presented at the 24th European Rotorcraft Forum in Marseille, Germany, Sep. 15–17, 1998.

Publication entitled "Design of a High Efficiency Discrete Servo–Flap Actuator for Helicopter Rotor Control" by Eric F. Prechtl and Steven R. Hall; pp. 158–182; SME vol. 3041, Dec. 1997.

Publication entitled "Application of smart materials to helicopter rotor active control" by Friedrich K. Straub, Mark A. Ealey and 'Mac' L. Mcd. Shetky; pp. 1–15; presented at SPIE's Symposium on Smart Structures and Materials, San Diego, CA, Mar. 3–6, 1997.

\* cited by examiner

*Primary Examiner*—Thomas M. Dougherty
(74) *Attorney, Agent, or Firm*—Harness Dickey & Pierce P.L.C.

(57) ABSTRACT

A piezoelectric actuator has a substantially increased critical buckling load and resistance to bending moments. The actuator includes a piezoelectric stack having a first column end, a second column end, and a first intermediate section. A rigid support device is axially aligned with the stack. The support device is moveably coupled to the stack at the first and second column ends such that rotational, lateral and vertical displacement of the stack is restrained and axial displacement of the stack is permitted at the column ends. The support device is further moveably coupled to the stack at at least one intermediate section such that rotational, lateral and vertical displacement of the stack is restrained and axial displacement of the stack is permitted at the intermediate section. The support device includes a support structure disposed adjacent to the stack, and an end restraint assembly fixedly coupled to the column ends. The end restraint assembly is also moveably coupled to the support structure. An intermediate restraint subassembly is fixedly coupled to the intermediate section and moveably coupled to the support structure.

20 Claims, 4 Drawing Sheets

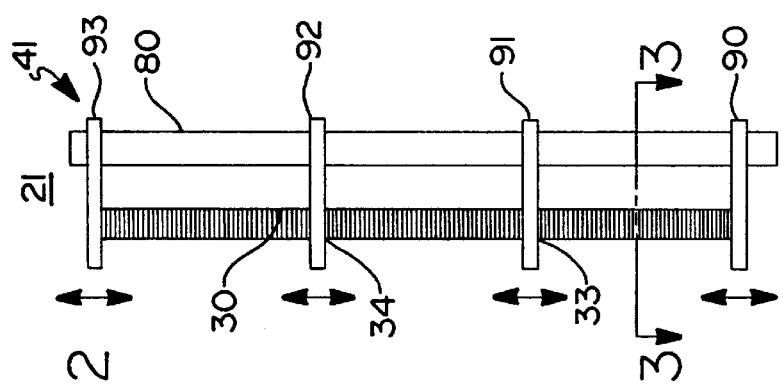
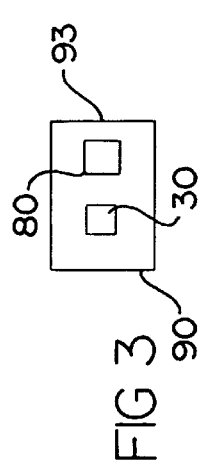
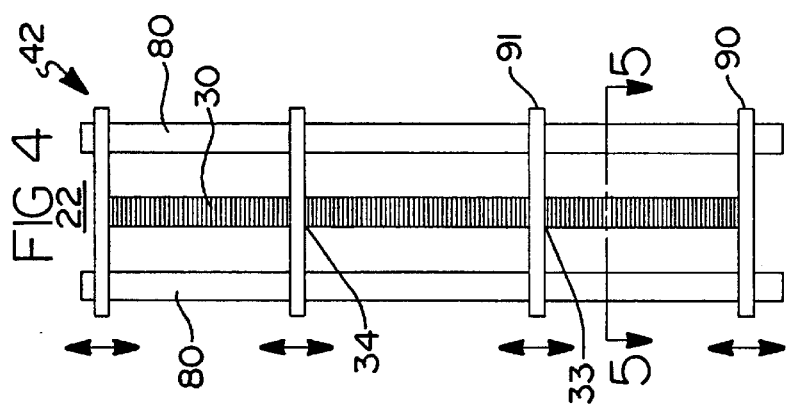
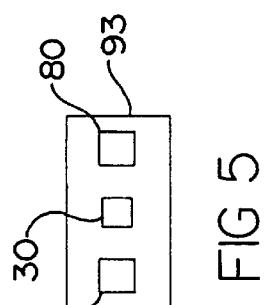
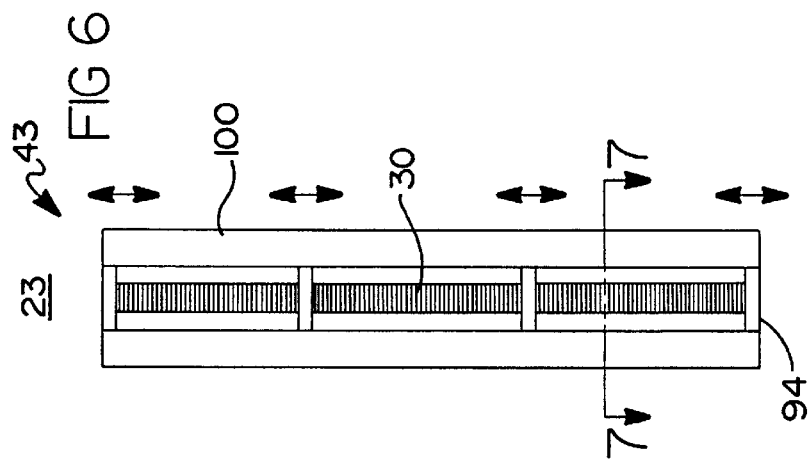
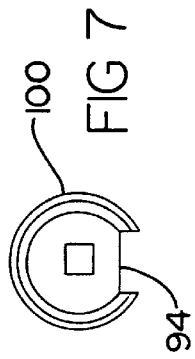

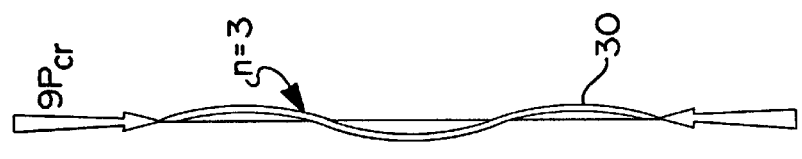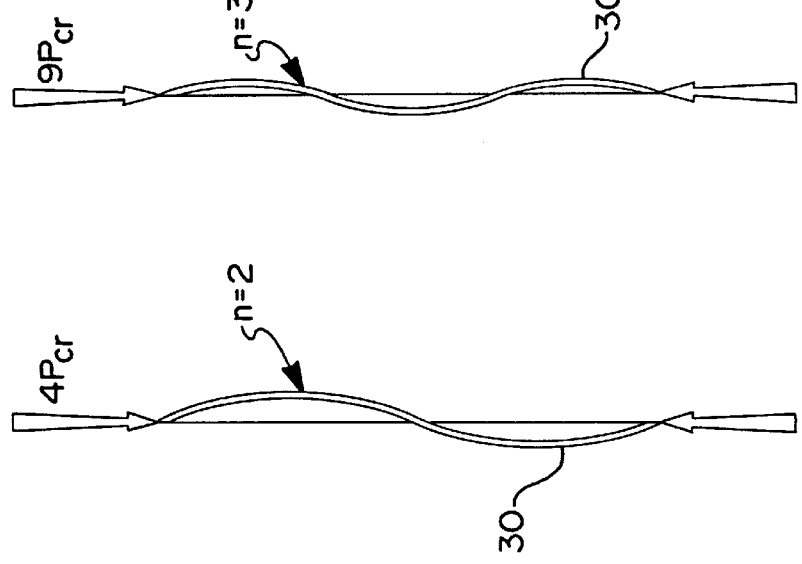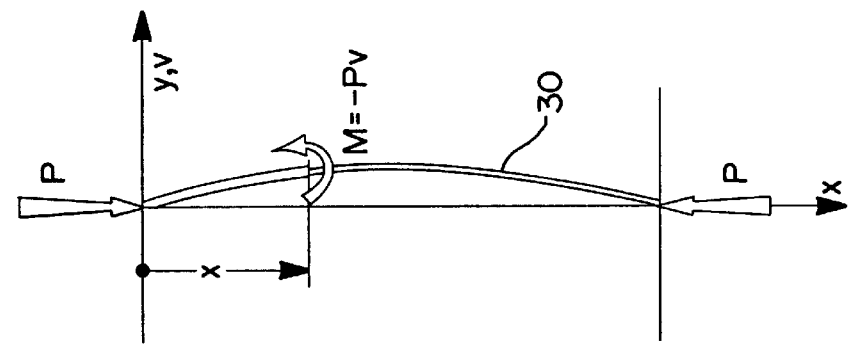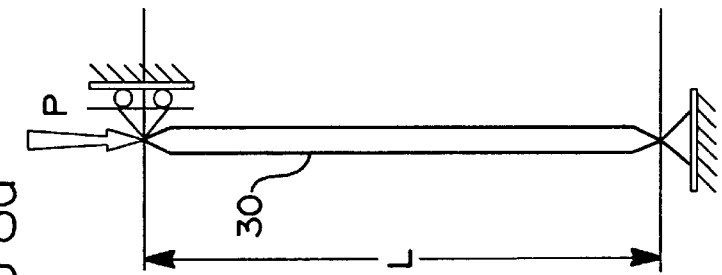

PIEZOELECTRIC SUPPORT DEVICE

STATEMENT REGARDING FEDERALLY SPONSORED RESEARCH OR DEVELOPMENT

The present invention was conceived or first built and tested in the course of work under U.S. Government Contract Number MDA972.98-3-0001, DARPA Smart Materials Program. The U.S. Government has certain rights in the invention.

TECHNICAL FIELD

The present invention relates generally to piezoelectric support devices. More particularly, the invention relates to a piezoelectric support device that substantially increases the critical loads at which buckling occurs in piezoelectric stacks.

BACKGROUND OF THE INVENTION

BACKGROUND ART

Piezoelectric materials have become more and more widely used in a large number of applications. For example, piezoelectric materials have the potential of allowing aircraft designers to minimize the number of required moving parts with high precision as well as increased compactness. Conventional piezoelectric materials, however, generally only work well in applications that require micro-displacement such as adaptive optics, printer jet control, pressure and acoustic transducers, etc. It is therefore desirable to provide a system and method which is readily adaptable to large displacement or stroke applications under high loads. Such a system would gain widespread acceptance in the aviation industry.

Due to the limited strain capability (i.e. elongation per unit voltage input) of piezoelectric materials, a number of piezoelectric segments are typically fixedly coupled or glued together to obtain a useful displacement (or stroke). As the displacement requirements increase, the "column" of piezoelectric material becomes longer. If the piezoelectric material column were made several widths long (or diameters high), when subjected to an axial force due to a load, the column could become laterally (or radially) unstable. Lateral buckling could therefore occur and the column could collapse. Moreover, higher performance piezoelectric materials have a lower elastic modulus. For example, PI piezoelectric stack material has 1649 micro strain output with an elastic modulus of 4.1 lb/in$^4$. In comparison, single Cr piezoelectric stack material has a higher strain output, 4718 micro strain, but an elastic modulus of only 1.5 lb/in$^4$. It is therefore desirable to provide a method and apparatus that will provide support to the stack and delay buckling when the piezoelectric material strength alone is not sufficient to handle the applied load.

Recent approaches have attempted to make use of the fact that midpoint support of the piezoelectric stack allows the use of shorter piezoelectric columns. For a pin-ended piezoelectric stack the critical buckling load is:

$$Pcr = (\pi^2 EI)/(Le^2)$$

Where E is the elastic modulus of the column material, I is the minimum moment of inertia of the column cross-section, and Le is the effective length of the column or distance from pin joint to pin joint (See A. C. Ugural S. K. Foster, Advanced Strength and Applied Elasticity, page 332 equation 11.3, incorporated herein by reference).

The bucking load of any column may therefore be increased by adding restraints along the length of the column, thereby reducing the effective length of the column. The most effective approach is to put an additional support in the middle of the column, thereby minimizing the distance between any two adjacent pin supports. This approach cuts the effective length in half, and hence quadruples the critical buckling load.

Under conventional approaches to reduce the effective column length, however, piezoelectric expansion or contraction will cause the midpoint support to rotate and introduce lateral motion. The piezoelectric displacement in the axial direction will be reduced due to the rotation and resulting lateral displacement of the piezoelectric stack. In addition, as the midpoint support rotates, the axial compression load will be uneven over the cross-sectional area, and the axial force will set up internal bending moments at various points of the piezoelectric column. Therefore, conventional midpoint supports require the use of end caps to minimize the bending moment. The total axial displacement will be further reduced, however, due to the end cap compliance and Hertzian losses. Hertzian losses result from application of a force over a point or over a line as opposed to over a plane. The reduced surface area associated with end cap compliance therefore ultimately reduces transfer of the force from the stack to the load. The conventional midpoint support also mounts on to the structure base, and any relative base motion between the structure base and the column ends is directly translated into piezoelectric performance loss. It is therefore desirable to provide intermediate support to a piezoelectric stack which is not subject to rotation, bending moments, end cap compliance, or Hertzian losses.

SUMMARY OF THE INVENTION

The above and other objects are provided by a piezoelectric actuator with a substantially increased critical buckling load and resistance to bending moments. The actuator includes a piezoelectric stack having a first column end, a second column end, and a first intermediate section. A rigid support device is axially aligned with the stack. The support device is moveably coupled to the stack at the first and second column ends such that rotational displacement of the stack is restrained and axial displacement of the stack is permitted at the column ends. The support device is further moveably coupled to the stack at the first intermediate section such that rotational displacement of the stack is restrained and axial displacement of the stack is permitted at the first intermediate section.

Further in accordance with the present invention, the support device includes a support structure disposed adjacent to the stack, and an end restraint assembly fixedly coupled to the column ends. The end restraint assembly is also moveably coupled to the support structure. An intermediate restraint subassembly is fixedly coupled to the first intermediate section and moveably coupled to the support structure.

The present invention also provides a method for supporting a piezoelectric stack. The method includes the steps of axially aligning a rigid support device with the stack, and moveably coupling the support device to the stack at a first column end and a second column end. Coupling at the column ends results in rotational displacement of the stack being restrained and axial displacement of the stack being permitted at the column ends. The support device is also moveably coupled to the stack at a first intermediate section such that rotational displacement of the stack is restrained and axial displacement of the stack is permitted at the first intermediate section.

BRIEF DESCRIPTION OF THE DRAWINGS

The various advantages of the present invention will become apparent to one skilled in the art by reading the following specification and sub-joined claims and by referencing the following drawings in which:

FIG. 2 is a side view of a piezoelectric actuator having a support device with a single support structure in accordance with a second embodiment of the present invention;

FIG. 3 is a cross-sectional view of the actuator shown in FIG. 2 taken along lines 3—3 in FIG. 2;

FIG. 4 is side view of a piezoelectric actuator having a support device with multiple support structures in accordance with a third embodiment of the present invention;

FIG. 5 is a cross-sectional view of the actuator shown in FIG. 4 taken along lines 5—5 in FIG. 4;

FIG. 6 is a side view of a piezoelectric actuator having a support device with a circular support structure in accordance with a fourth preferred embodiment of the present invention;

FIG. 7 is a cross-sectional view of the actuator shown in FIG. 6 taken along lines 7—7 in FIG. 6;

FIGS. 8($a$–$e$) is a diagram demonstrating the first three buckling modes of a pin-ended piezoelectric stack.

DETAILED DESCRIPTION OF THE PREFERRED EMBODIMENTS

Figure 1:
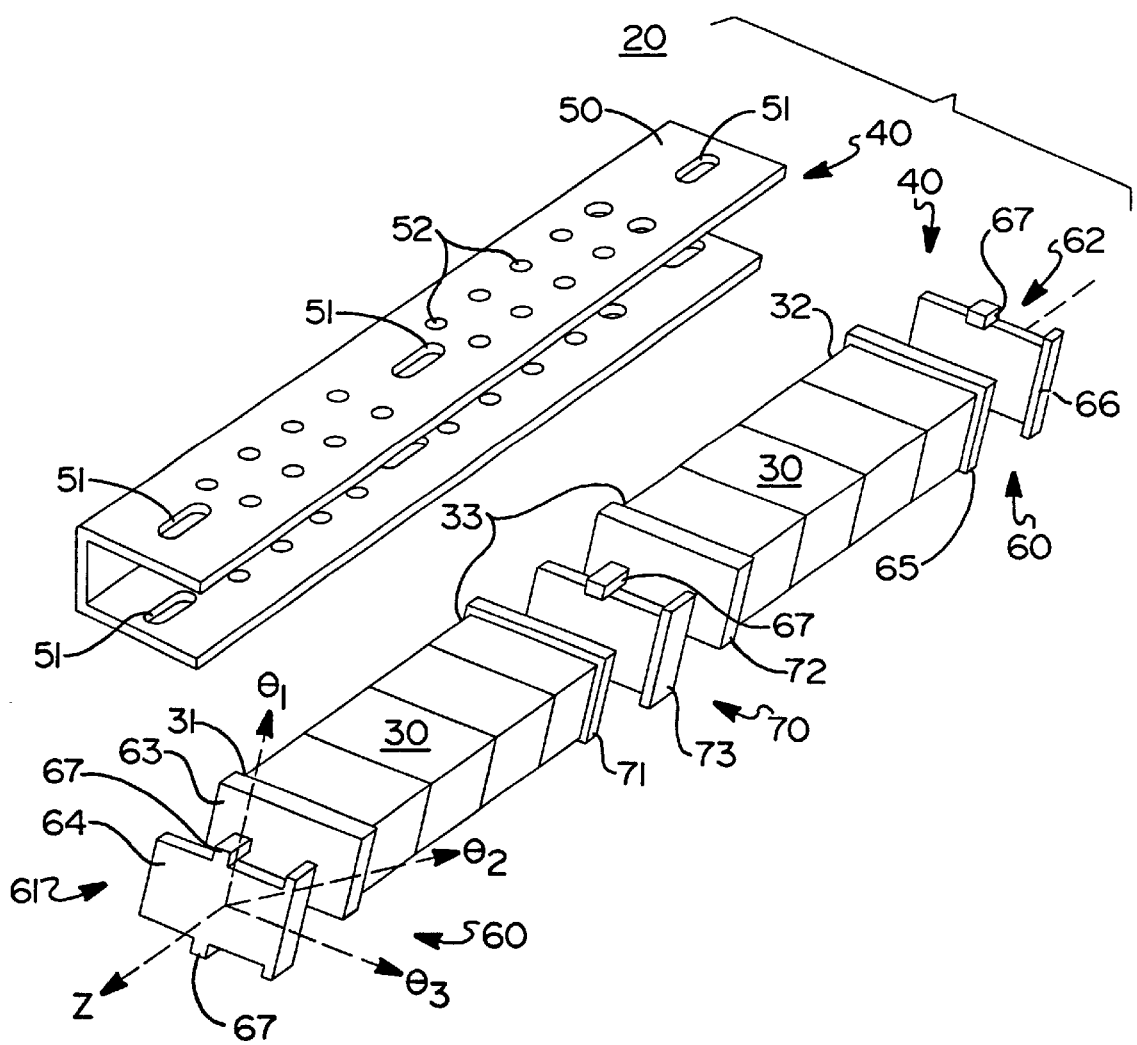
FIG. 1 is an exploded perspective view of a piezoelectric actuator in accordance with a preferred embodiment of the present invention.

Referring to FIG. 1, the preferred piezoelectric actuator 20 is shown in an exploded view. Actuator 20 includes a piezoelectric stack 30 having a first column end 31, a second column end 32, and a first intermediate section 33. A rigid support device 40 is axially aligned with the stack 30, where the support device 40 is moveably coupled to the stack 30 at the first and second column ends 31, 32 such that rotational, lateral and vertical displacement of the stack 30 is restrained and axial displacement of the stack 30 is permitted at the column ends 31, 32. The support device 40 is preferably made of a high strain and low density material such as titanium or any other material which is stronger than the stack material. The support device 40 is also moveably coupled to the stack 30 at the first intermediate section 33 such that rotational, lateral and vertical displacement of the stack 30 is restrained and axial displacement of the stack is permitted at the first intermediate section 33.

It will be appreciated that displacement of the stack along axis Z is the only desirable displacement of stack 30. Thus, support device 40 eliminates displacement of the stack 30 in rotational directions such as about axis $\theta_1$, $\theta_2$, and $\theta_3$ lying in a plane perpendicular to axis Z. It can further be seen that rotational motion of stack 30, particularly at the first intermediate section 33, has a radial component which is removed by support device 40. Thus, allowing the support device 40 to be moveably coupled to the stack 30 along axis Z effectively filters out all non-axial displacement of stack 30. The ability to filter out such unwanted displacements provides a mechanism for intermediate support which is not subject to rotation, bending moments, end cap compliance, or Hertzian losses.

Specifically, support device 40 includes a support structure 50 disposed adjacent to the stack 30, and an end restraint assembly 60 fixedly coupled to the column ends 31, 32 and moveably coupled to the support structure 50 along axis Z. An intermediate restraint subassembly 70 is fixedly coupled to the first intermediate section 33 and moveably coupled to the support structure 50 along axis Z. The end restraint assembly 60 includes a first end subassembly 61 fixedly coupled to the first column end 31 and moveably coupled to the support structure 50 along axis Z. The end restraint assembly 60 further includes a second end subassembly 61 fixedly coupled to the second column end 32 and moveably coupled to the support structure 50 along axis Z. The first end subassembly 61 includes a first lateral constraint plate 63 fixedly coupled to the first column end 31, and a first end guidance plate 64 coupled to the first lateral constraint plate 63 and moveably coupled to the support structure 50 along axis Z. Similarly, the second end subassembly 62 includes a second lateral constraint plate 65 fixedly coupled to the second column end 32, and a second end guidance plate 66 coupled to the second lateral constraint plate 65 and moveably coupled to the support structure 50 along axis Z.

It will further be appreciated that at least one intermediate restraint subassembly 70 intersects the stack 30 near at least one first intermediate section 33. In one preferred embodiment, the intermediate restraint subassembly 70 includes a first intermediate lateral constraint plate 71 fixedly coupled to a first intermediate end of the stack 30. A second intermediate lateral constraint plate 72 is fixedly coupled to a second intermediate end of the stack 30. The first and second intermediate lateral constraint plates 71, 72 therefore have opposing surfaces. The intermediate restraint subassembly 70 further includes an intermediate guidance plate 73 coupled to the opposing surfaces of the first and second intermediate lateral constraint plates 71, 72. It can further be seen that the intermediate guidance plate 73 is moveably coupled to the support structure 50 along axis Z. Lateral constraint plates 63, 71, 72, and 65 contact the entire cross-sectional surface area of stack 30 such that Hertzian losses are minimized.

While one preferred embodiment has been described above for the case in which the first intermediate section 33 is located approximately midway between the first column end 31 and the second column end 32, additional intermediate sections can be readily implemented. It will further be appreciated that while the preferred actuator 20 is shown to have a piezoelectric stack 30 with a rectangular cross-section, other cross-section geometries such as square or circular cross-sections can be used without parting from the spirit and scope of the invention.

It is preferred that guidance plates 64, 73, and 66 have a plurality of square or rectangular shaped guidance pins 67 axially aligned with the stack 30 and guidance slots 51 in the support structure. The guidance pins 67 are moveably retained within the guidance slots 51 to provide moveable coupling between the support structure 50 and the stack 30 as well as rotational restraint. It can further be seen that the support structure 50 also includes a plurality of wire connection apertures 52 for permitting electrical connection to the stack 30.

Figure 9B:
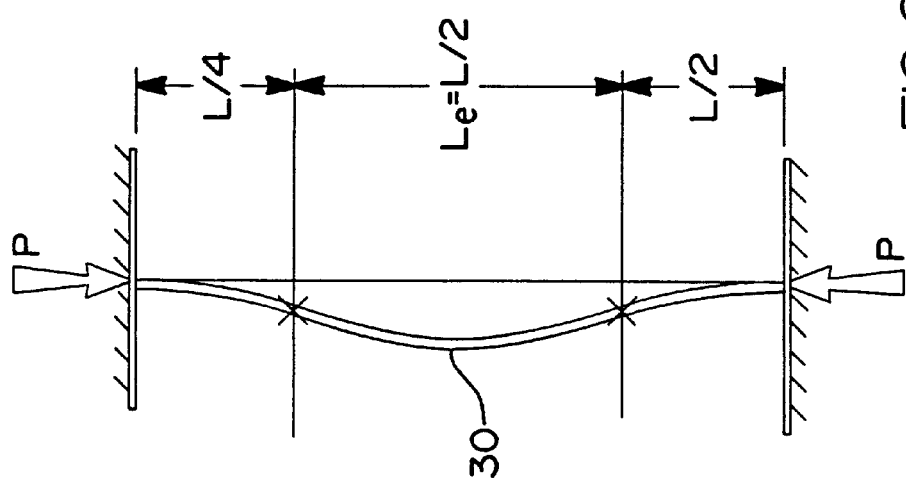
FIGS. 9($a,b$) is a diagram demonstrating the effective lengths of a piezoelectric stack with lateral constraint plates.
Figure 9A:
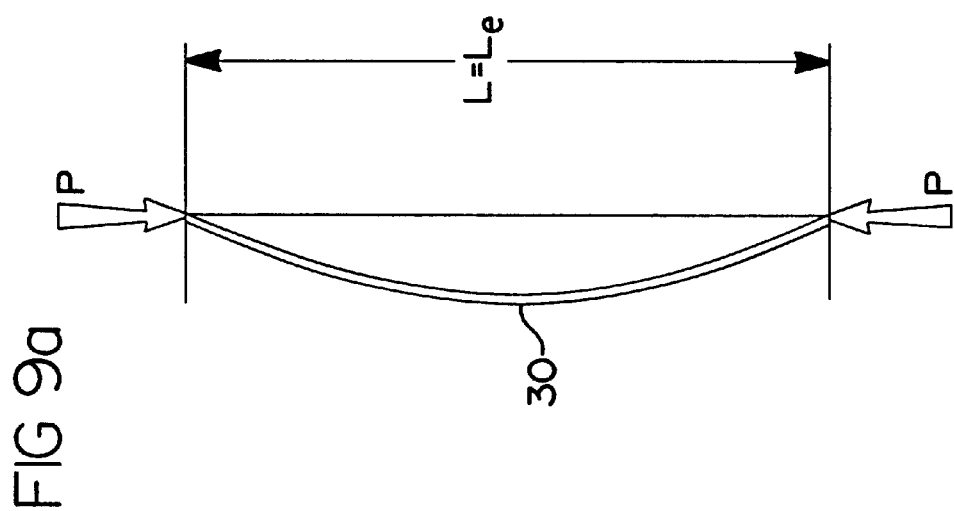

Turning now to FIG. 2, a piezoelectric actuator 21 is shown in accordance with a second preferred embodiment of the present invention. It can be seen that support device 41 has a single support structure 80 and is coupled to the stack 30 at multiple intermediate sections. As shown in FIGS. 8 and 9, adding intermediate sections increases the critical buckling load at additional buckling modes. With continuing reference to FIGS. 2 and 3, support device 41 also includes a simplified first end lateral restraint plate 90, second end lateral restraint plate 93, first intermediate lateral restraint plate 91, and second intermediate lateral restraint plate 92. As best seen in FIG. 3, first end lateral restraint plate 90 supports the stack 30 at the first end. Specifically, the first end lateral restraint plate 90 includes a support aperture 93. The support aperture 93 receives the support structure 80 and is moveably coupled to the support structure 80. It can also be seen that the stack 30 further includes a second intermediate section 34. The support device 41 is moveably coupled to the stack 30 at the second intermediate section 34 such that rotational displacement of the stack 30 is restrained and axial displacement of the stack is permitted at the second intermediate section 34.

FIG. 4 shows a third preferred embodiment of the present invention. Specifically, piezoelectric actuator 22 includes a support device 42 with multiple support structures 80. Thus, rigidity is increased by restraining rotational displacement of the stack 30 from opposing sides. FIG. 5 demonstrates this approach to multiple support from a cross-sectional view. It can be seen that first end lateral restraint plate 90 has multiple support apertures 93 for receiving multiple support structures 80.

Turning now to FIG. 6, a piezoelectric actuator 23 having a support device 43 with a circular support structure 100 in accordance with a fourth preferred embodiment of the present invention is shown. The cross-sectional view of FIG. 7 demonstrates that circular support structure 100 substantially surrounds first end lateral restraint plate 94.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, specification and the following claims.

What is claimed is:

1. A piezoelectric actuator comprising:
   a piezoelectric stack having a first column end, a second column end, and a first intermediate section; and
   a rigid support device axially aligned with the stack, the support device moveably coupled to the stack at the first and second column ends such that rotational displacement of the stack is restrained and axial displacement of the stack is permitted at the column ends;
   said support device moveably coupled to the stack at the first intermediate section such that rotational displacement of the stack is restrained and axial displacement of the stack is permitted at the first intermediate section.

2. The actuator of claim 1 wherein the support device further includes:
   a support structure disposed adjacent to the stack;
   an end restraint assembly fixedly coupled to the column ends and moveably coupled to the support structure; and
   an intermediate restraint subassembly fixedly coupled to the first intermediate section and moveably coupled to the support structure.

3. The actuator of claim 2 wherein the end restraint assembly includes:
   a first end subassembly fixedly coupled to the first column end and moveably coupled to the support structure; and
   a second end subassembly fixedly coupled to the second column end and moveably coupled to the support structure.

4. The actuator of claim 3 wherein the first end subassembly includes:
   a first lateral constraint plate fixedly coupled to the first column end; and
   a first end guidance plate coupled to the first lateral constraint plate and moveably coupled to the support structure.

5. The actuator of claim 3 wherein the second end subassembly includes:
   a second lateral constraint plate fixedly coupled to the second column end; and
   a second end guidance plate coupled to the second lateral constraint plate and moveably coupled to the support structure.

6. The actuator of claim 2 wherein the intermediate restraint subassembly intersects the stack at the first intermediate section, the intermediate restraint subassembly including:
   a first intermediate lateral constraint plate fixedly coupled to a first intermediate end of the stack;
   a second intermediate lateral constraint plate fixedly coupled to a second intermediate end of the stack, the first and second intermediate lateral constraint plates having opposing surfaces; and
   an intermediate guidance plate coupled to the opposing surfaces of the first and second intermediate lateral constraint plates, the intermediate guidance plate moveably coupled to the support structure.

7. The actuator of claim 1 wherein the first intermediate section is located approximately midway between the first column end and the second column end.

8. The actuator of claim 1 wherein the stack further includes a second intermediate section, the support device moveably coupled to the stack at the second intermediate section such that rotational displacement of the stack is restrained and axial displacement of the stack is permitted at the second intermediate section.

9. The actuator of claim 8 wherein the first and second intermediate sections divide the stack into three approximately equal portions.

10. The actuator of claim 1 wherein the stack has a rectangular cross-section.

11. The actuator of claim 1 wherein the stack has a square cross-section.

12. The actuator of claim 1 wherein the stack has a circular cross-section.

13. A support device for radially restraining a piezoelectric stack having a first column end, a second column end, and a first intermediate section, the support device comprising:
   a support structure disposed adjacent to the stack;
   an end restraint assembly fixedly coupled to the column ends and moveably coupled to the support structure such that rotational displacement of the stack is restrained and axial displacement of the stack is permitted at the column ends; and
   an intermediate restraint subassembly fixedly coupled to the first intermediate section and moveably coupled to the support structure such that rotational displacement of the stack is restrained and axial displacement of the stack is permitted at the first intermediate section.

14. The support device of claim 13 wherein the end restraint assembly includes:
   a first end subassembly fixedly coupled to the first column end and moveably coupled to the support structure; and a second end subassembly fixedly coupled to the second column end and moveably coupled to the support structure.

15. The support device of claim 14 wherein the intermediate restraint subassembly intersects the stack at the first intermediate section, the intermediate restraint subassembly including:

a first intermediate lateral constraint plate fixedly coupled to a first intermediate end of the stack;

a second intermediate lateral constraint plate fixedly coupled to a second intermediate end of the stack, the first and second intermediate lateral constraint plates having opposing surfaces; and an intermediate guidance plate coupled to the opposing surfaces of the first and second intermediate lateral constraint plates, the intermediate guidance plate moveably coupled to the support structure.

16. The support device of claim 15 wherein the intermediate guidance plate has a plurality of guidance pins axially aligned with the stack and the support structure has a corresponding plurality of guidance slots axially aligned with the stack, the guidance pins moveably retained within the guidance slots.

17. The support device of claim 13 wherein the support structure further includes a plurality of wire connection apertures for permitting electrical connection to the stack.

18. A method for supporting a piezoelectric stack, the method comprising the steps of:

axially aligning a rigid support device with the stack;

moveably coupling the support device to the stack at a first column end and a second column end such that rotational displacement of the stack is restrained and axial displacement of the stack is permitted at the column ends; and moveably coupling the support device to the stack at a first intermediate section such that rotational displacement of the stack is restrained and axial displacement of the stack is permitted at the first intermediate section.

19. The method of claim 18 further including the step of moveably coupling the support device to the stack at a second intermediate section such that rotational displacement of the stack is restrained and axial displacement of the stack is permitted at the second intermediate section.

20. The method of claim 18 further including the step of surrounding the stack at the first intermediate section with an intermediate restraint subassembly.

* * * * *